United States Patent
Ma et al.

(10) Patent No.: US 11,424,237 B2
(45) Date of Patent: Aug. 23, 2022

(54) MEMORY DEVICE

(71) Applicants: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

(72) Inventors: Yuan Ma, Shanghai (CN); Ke-Liang Shang, Nanjing (CN); Xin-Yong Wang, Shanghai (CN)

(73) Assignees: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

( * ) Notice: Subject to any disclaimer, the term of this patent is extended or adjusted under 35 U.S.C. 154(b) by 162 days.

(21) Appl. No.: 16/928,988

(22) Filed: Jul. 14, 2020

(65) Prior Publication Data
US 2021/0375852 A1 Dec. 2, 2021

(30) Foreign Application Priority Data
May 29, 2020 (CN) .......................... 202010472734.5

(51) Int. Cl.
*H01L 27/02* (2006.01)
*G06F 30/392* (2020.01)
*H01L 27/11* (2006.01)

(52) U.S. Cl.
CPC ........ *H01L 27/0207* (2013.01); *G06F 30/392* (2020.01); *H01L 27/1104* (2013.01); *H01L 27/1116* (2013.01)

(58) Field of Classification Search
CPC ............. H01L 27/0207; H01L 27/1104; H01L 27/1116; G06F 30/392
See application file for complete search history.

(56) References Cited

U.S. PATENT DOCUMENTS

| 6,665,204 | B2 | 12/2003 | Takeda |
| 2005/0276128 | A1 | 12/2005 | Min et al. |
| 2007/0146178 | A1* | 6/2007 | Lewis ................ H03K 19/1776 341/106 |
| 2009/0103390 | A1 | 4/2009 | Kim et al. |

FOREIGN PATENT DOCUMENTS

TW 357366 B 5/1999

* cited by examiner

*Primary Examiner* — Walter H Swanson
(74) *Attorney, Agent, or Firm* — Maschoff Brennan

(57) ABSTRACT

A memory device includes a first plurality of program lines of a first group, a second plurality of program lines of a second group, and a plurality of address lines. The second plurality of program lines are disposed next to and are parallel to the first plurality of program lines. The plurality of address lines are coupled to the first plurality of program lines and the second plurality of program lines respectively. The plurality of address lines are twisted and are intersected with the first plurality of program lines and the second plurality of program lines in a layout view. At least two adjacent program lines of the first plurality of program lines or the second plurality of program lines have lengths different from each other. A method is also disclosed herein.

20 Claims, 12 Drawing Sheets

MEMORY DEVICE

CROSS-REFERENCE TO RELATED APPLICATION(S)

This application claims priority to China Application Serial Number 202010472734.5, filed May 29, 2020, which is herein incorporated by reference.

BACKGROUND

Static random access memory (SRAM) is one type of semiconductor memory having an array of memory cells. In operations, a specified memory cell is activated by a corresponding word line and a corresponding bit line, and both of the word lines and the bit lines are selected by a control circuit comprising address lines. The SRAM is designed according to routing, for example, including the word lines, the bit lines and the address lines, and parasitic capacitance thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
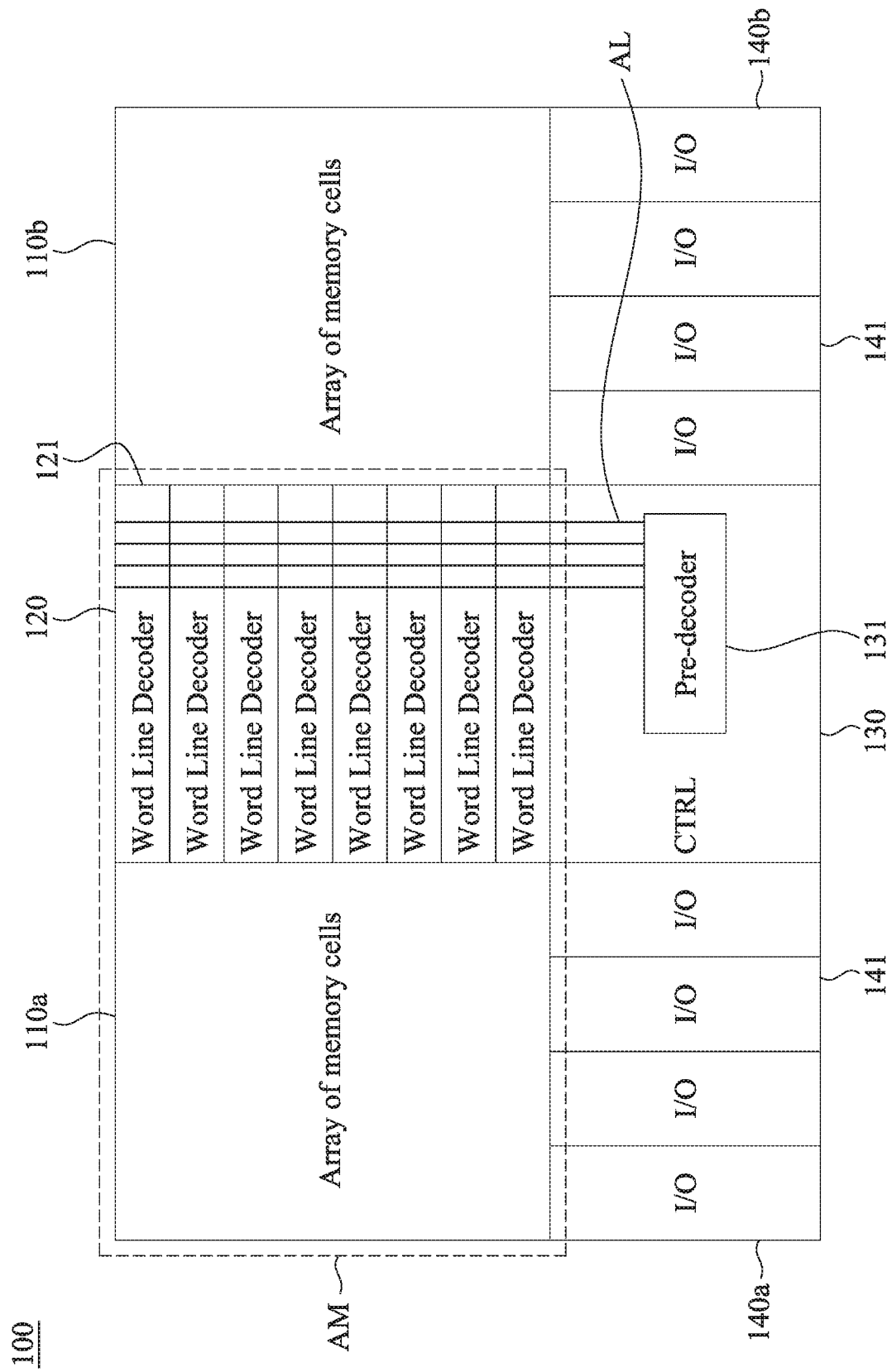
FIG. 1 is a schematic diagram of a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

FIG. 1 illustrates a schematic diagram of a memory device 100, in accordance with some embodiments of the present disclosure. In some embodiments, the memory device 100 is implemented by static random access memory (SRAM). For illustration in FIG. 1, the memory device 100 includes an array of memory cells 110a, an array of memory cells 110b, a program circuit 120, a control circuit 130, an input/output (I/O) circuitry 140a and an I/O circuitry 140b. The program circuit 120 is disposed between the array of memory cells 110a and the array of memory cells 110b, and is coupled through word lines (not shown in FIG. 1) to the array of memory cells 110a and the array of memory cells 110b. The control circuit 130 is coupled through address lines AL to the program circuit 120, and is also indicated as "CTRL" in FIG. 1. The control circuit 130 is further coupled to the I/O circuitry 140a and the I/O circuitry 140b. The I/O circuitry 140a and the I/O circuitry 140b are coupled to the array of memory cells 110a and the array of memory cells 110b, respectively.

Each of the array of memory cells 110a and the array of memory cells 110b includes memory cells (not shown) arranged in rows and columns. In some embodiments, each of the memory cells is configured to store a bit data based on signals transmitted from the I/O circuitry 140a, the I/O circuitry 140b and the word lines. In some embodiments, each of the memory cells is implemented by 6 or 8 transistors.

In some embodiments, the program circuit 120 is also referred to a decoder circuit. For illustration in FIG. 1, the program circuit 120 includes word line decoders 121 arranged in columns, and each of the word line decoders 121 corresponds to one memory cell of the array of memory cells 110a and one memory cells of the array of memory cells 110b. In some embodiments, each of the word line decoders 121 includes logic operators (not shown) to decode voltages of the address lines AL, for identifying which word line to be charged or be activated. The address lines AL are charged to logic high or logic low by a pre-decoder 131 included in the control circuit 130, for selecting which memory cell to be read or be written in bit data.

Each of the I/O circuitry 140a and the I/O circuitry 140b includes I/O circuits 141 arranged in rows, and each of the I/O circuits 141 corresponds to one memory cell of the array of memory cells 110a or one memory cell of the array of memory cells 110b, for reading or writing the bit data into the corresponding memory cell. The I/O circuits 141 are indicated as "I/O" in FIG. 1.

The number of the word line decoders 121 and the address lines AL is determined based on a total number of word lines in the array of memory cells 110a and the array of memory cells 110b. For example, k address lines AL are used for $2^k$ word lines. Alternatively stated, one of the address lines AL is used when one of the array of memory cells 110a or the array of memory cells 110b includes two word lines, two address lines AL are used when the array of memory cells 110a or the array of memory cells 110b includes three or four word lines, three address lines AL are used when the array of memory cells 110a or the array of memory cells 110b includes four to eight word lines, and so on.

The above numbers of the word line decoders 121, the address lines AL and the I/O circuit 141 are given for illustrative purposes, and various numbers of the same are within the contemplated scope of the present disclosure.

The configuration of the memory device 100 as illustrated above is also given for illustrative purposes. Various configurations of the memory device 100 are within the contemplated scope of the present disclosure. For example, in various embodiments, the array of memory cells 110a and the array of memory cells 110b are disposed abutting to each other, and are also referred to as one array of memory cells. In some embodiments, the array of memory cells 110a and the array of memory cells 110b are identical to each other.

For simplicity of illustration, only part of the memory device 100 including the array of memory cells 110a, the word line decoders 121 and the address lines AL, labeled as "AM" in FIG. 1, is further discussed below.

Figure 2:
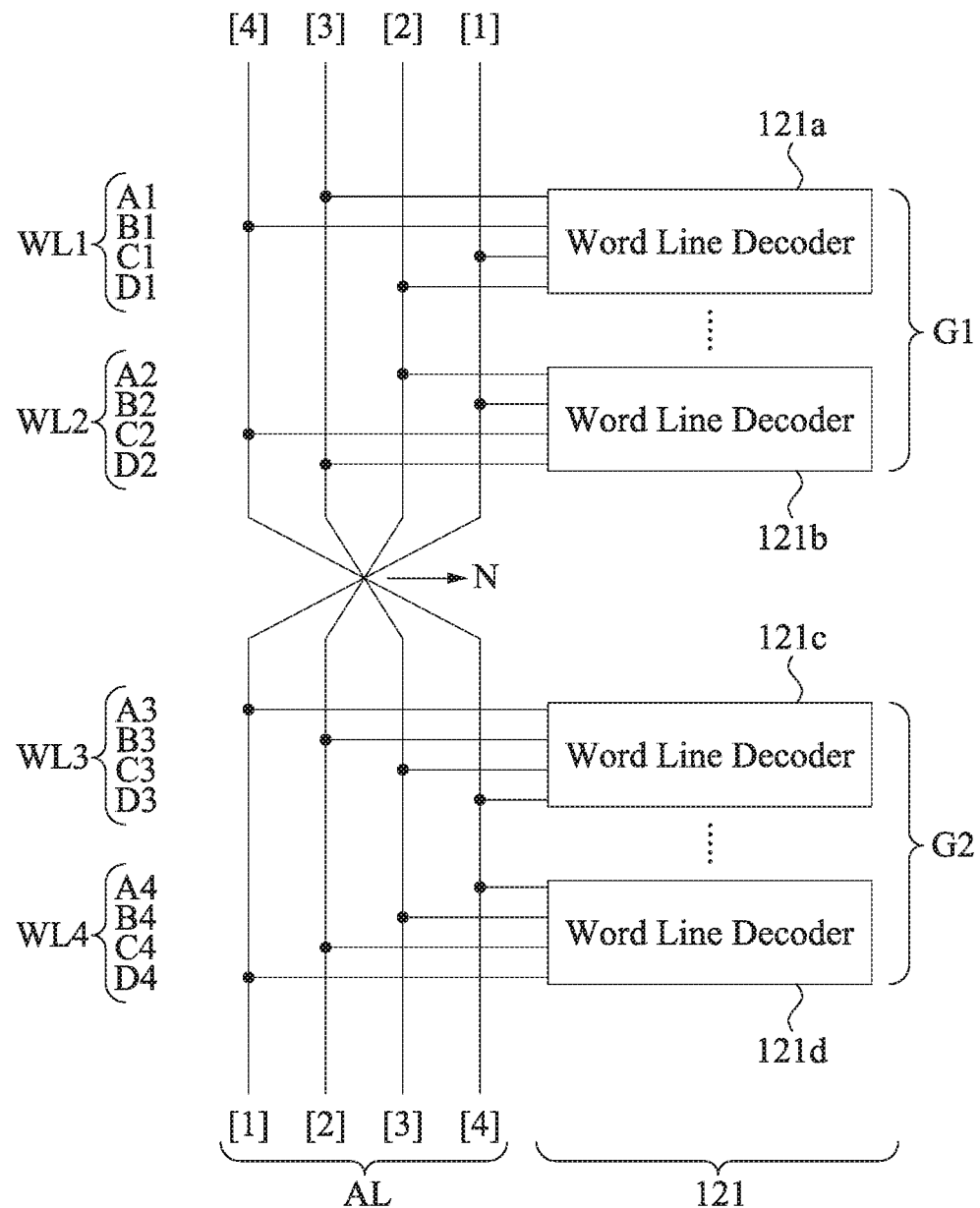
FIG. 2 is a schematic diagram of a memory device shown in FIG. 1, in accordance with some embodiments of the present disclosure.

Reference is now made to FIG. 2. FIG. 2 is a schematic diagram of a memory device AM corresponding to a part of the memory device 100 shown in FIG. 1, in accordance with some embodiments of the present disclosure. With respect to the embodiments of FIG. 1, like elements in FIG. 2 are designated with the same reference numbers for ease of understanding. For simplicity of illustration, memory cells of the array of memory cells 110a, the control circuit 130 and the I/O circuitry 140a are not shown in FIG. 2.

For illustration in FIG. 2, the memory device AM includes word line decoders 121 grouped into groups G1 and G2, sets of word lines WL1-WL4, and twisted address lines AL which are twisted at a twisted spot N.

Compared to the embodiments illustrated in FIG. 1, the word line decoders 121 include the word line decoder 121a, 121b, 121c and 121d arranged in columns. For simplicity, each of the word line decoders 121a, 121b, 121c and 121d is referenced as 121 hereinafter for illustration, because each of the word line decoder 121a, 121b, 121c and 121d operates in a similar way in some embodiments.

Each of the word line decoders 121 is coupled to the corresponding set of word lines WL1, WL2, WL3 and WL4, respectively, for receiving signals transmitted from the address lines AL. For illustration in FIG. 2, the word line decoder 121a is coupled to a set of word lines WL1 including the word lines A1, B1, C1 and D1; the word line decoder 121b is coupled to a set of word lines WL2 including the word lines A2, B2, C2 and D2; the word line decoder 121c is coupled to a set of word lines WL3 including the word lines A3, B3, C3 and D3; and the word line decoder 121d is coupled to a set of word lines WL4 including the word lines A4, B4, C4 and D4. For simplicity, each of the word line A1-A4, B1-B4, C1-C4 and D1-D4 is referenced as WL hereinafter for illustration, because each of the word lines A1-A4, B1-B4, C1-C4 and D1-D4 operates in a similar way in some embodiments.

Each of the word lines WL extends from a via (which is illustrated as a spot at the intersection with both of the word lines WL and the address lines AL) to the corresponding word line decoders 121. For example, with reference to FIG. 2, the word line A1 extends from the via (which is a spot interacted with the word line A1 and the address line [3]) to the word line decoder 121a. Alternatively stated, the word line A1 is a metal line extending from the via to the word line decoder 121a. To explain in other way, a length of the word line A1 is a length from the via to the word line decoder 121a.

In some embodiments, with reference to FIG. 2, the word line decoders 121a, the word line decoders 121b and other word line decoders (not shown) disposed between the word line decoders 121a and the word line decoders 121b are indicated as a group G1. In addition, the word line decoders 121c, the word line decoders 121d and other word line decoders (not shown) disposed between the word line decoders 121c and the word line decoders 121d are indicated as another group G2 that is disposed next to the group G1. Alternatively stated, the word line decoders 121 are split into groups including a first group G1 and a second group G2 that is disposed next to the first group G1. Therefore, the word lines coupled to the corresponding word line decoders 121 are also split into the groups correspondingly.

The number and arrangement of the word line decoders 121 or the word lines WL shown in FIG. 2 are given for illustrative purposes. Various numbers and arrangements of the word line decoders 121 or the word lines WL to implement the memory device AM in FIG. 2 are within the contemplated scope of the present disclosure. For example, in various embodiments, in addition to the word line decoders 121*a*, 121*b*, 121*c* and 121*d* shown in FIG. 2, the memory device AM includes more than one word line decoder coupled to another set of the word lines. In other various embodiments, in addition to the word lines A1, B1, C1 and D1 included in the first set of word lines shown in FIG. 2, the word line decoder 121*a* includes more than one word line.

With continued reference to FIG. 2, the address lines AL extend substantially along columns. The address lines AL include address lines [1], [2], [3] and [4], and the address lines AL are intersected with the word lines WL that are extending along rows, for transmitting signals output from a pre-decoder (e.g., the pre-decoder 131 shown in FIG. 1) to the corresponding word line decoders 121. Each of the address lines [1], [2], [3] and [4] is coupled through the via to each of the word line decoders 121 correspondingly.

For example, the address line [1] is coupled through the word line C1 to the word line decoder 121*a*, coupled through the word line B2 to the word line decoder 121*b*, coupled through the word line A3 to the word line decoder 121*c*, and coupled through the word line D4 to the word line decoder 121*d*. The address line [2] is coupled through the word line D1 to the word line decoder 121*a*, coupled through the word line A2 to the word line decoder 121*b*, coupled through the word line B3 to the word line decoder 121*c*, and coupled through the word line C4 to the word line decoder 121*d*. The address line [3] is coupled through the word line A1 to the word line decoder 121*a*, coupled through the word line D2 to the word line decoder 121*b*, coupled through the word line C3 to the word line decoder 121*c*, and coupled through the word line B2 to the word line decoder 121*d*. The address line [4] is coupled through the word line B1 to the word line decoder 121*a*, coupled through the word line C2 to the word line decoder 121*b*, coupled through the word line D3 to the word line decoder 121*c*, and coupled through the word line A4 to the word line decoder 121*d*.

Moreover for illustration in FIG. 2, the address lines AL are twisted between the word lines of the group G1 and the word lines of the group G2, and it is label as a spot N in FIG. 2. Alternatively stated, the address lines AL are twisted and have a twisted spot N. The twisted spot N is disposed between the word lines WL of the abutting groups G1 and G2. Specifically, each of the address lines [1], [2], [3] and [4] are twisted and have a twisted spot N. The twisted spot N is disposed between the word lines A2-D2 of the group G1 and the word lines A3-D3 of the group G2.

Furthermore, the two adjacent word lines WL have different lengths. Alternatively stated, for each of the word line decoders 121, the word lines WL have lengths different from each other. For example, with reference to FIG. 2, for the word line decoder 121*a*, a length of the word line A1 is different from any of a length of the word line B1, a length of the word line C1, or a length of the word line D1.

In addition, at least one of the word lines WL of one group (e.g., group G1) and at least one of the word lines WL of another group (e.g., group G2) have same lengths. Alternatively stated, for one group (e.g., group G1), one of the word lines WL has a length that is as same as a length of one of the word lines WL of another group (e.g., group G2). For example, with reference to FIG. 2, a length of the word line A1 of the group G1 is equal to a length of the word line B3 of the group G2.

Moreover, in some embodiments, the word lines WL of the different groups (e.g., groups G1 and G2) have same total lengths. Alternatively stated, a total length of the word lines WL of one group (e.g., group G1) is equal to a total length of the word lines WL of another group (e.g., group G2). For example, with reference to FIG. 2, a total length of the word lines, including the word lines A1-D1 and A2-D2 of the group G1, is equal to a total length of the word lines, including the word lines A3-D3 and A4-D4 of the group G2.

Furthermore, the word lines WL that are interacted with the different address lines AL have same total lengths. Alternatively stated, for each one of the address lines AL, a total length of the word lines WL that are interacted with the corresponding address lines AL is as same as one another. That is, a total length of the word lines WL that are coupled to one of the address lines AL is equal to a total length of the word lines WL that are coupled to another one of the address lines AL.

For example, with reference to FIG. 2, for the address line [1], a total length of the word lines WL, indicated as a first length, includes a length of word line C1, a length of word line B2, a length of word line A3 and a length of word line D4. For the address line [2], a total length of the word lines WL, indicated as a second length, includes a length of word line D1, a length of word line A2, a length of word line B3 and a length of word line C4. For the address line [3], a total length of the word lines WL, indicated as a third length, includes a length of word line A1, a length of word line D2, a length of word line C3 and a length of word line B4. For the address line [4], a total length of the word lines WL, indicated as a fourth length, includes a length of word line B1, a length of word line C2, a length of word line D3 and a length of word line A4. The first length, the second length, the third length, and the fourth length are as same as each other.

The above configuration of the memory device AM is provided for illustrative purposes. Various implementations of the memory device AM are within the contemplated scope of the present disclosure. For example, in various embodiments, the twisted lines are implemented by other signal lines, including, for example, output metal lines coupled to the pre-decoder (which is shown in FIG. 1), input metal lines coupled to the pre-decoder, input vias coupled to the word line decoders 121, output metal lines coupled to the word line decoders 121, or all combinations thereof. In other embodiments, the twisted lines are implemented in other metal layers, including, for example, other metal layers rather than M1 or M2 layer, layers disposed with vias, layers disposed with poly segments for forming gates of transistors, layers disposed with active area for forming transistors, any conductors, or all combinations thereof.

In some approaches, some of the word lines that are interacted with the corresponding address lines have total lengths that are different from one another by cutting the redundant routings of the word lines. Since a length of the word lines corresponds to a parasitic capacitance. As the length being longer, the parasitic capacitance being higher. If a total length of the word lines corresponds to each of the address lines is different from one another, the parasitic capacitance corresponds to each of the address lines is also different from one another, and it is also indicated as unbalanced parasitic capacitance. The unbalanced parasitic capacitance would lead to poor performance of the memory device.

Compared to the above approaches, in the embodiments of the present disclosure, for example with reference to FIG. 2, for each one of the address lines AL that are twisted, a total length of the word lines WL that are coupled to each of the address lines AL is as same as one another. Therefore, the parasitic capacitance corresponds to each of the address lines AL is also same as one another, and it is also indicated as balanced parasitic capacitance. Accordingly, the memory device AM keeps the balanced parasitic capacitance with redundant routings of the word lines. Furthermore, a total parasitic capacitance of the memory device AM is reduced compared to the above approaches. On the other hand, in the embodiments of the present disclosure, it does not affect circuit operations of the memory device AM, area design of the memory device AM and design rule of a layout for implementing the memory device AM.

Figure 3:
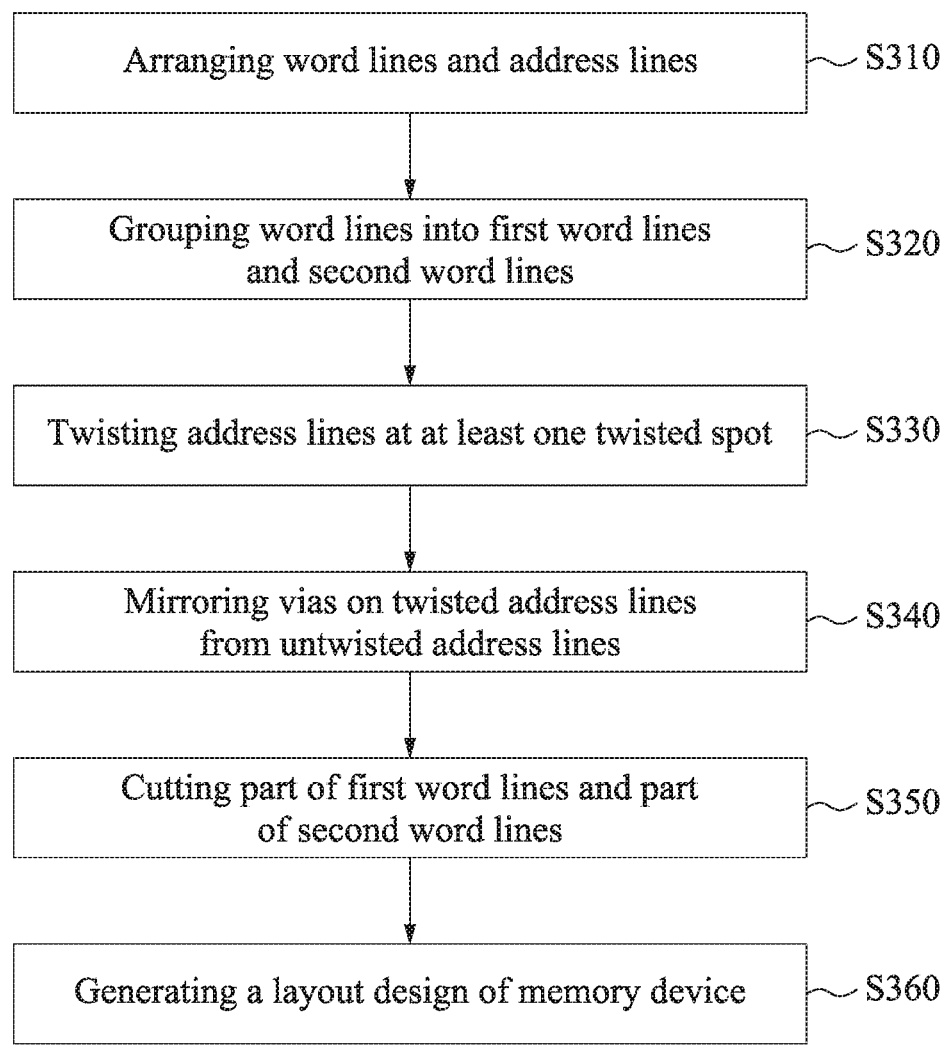
FIG. 3 is a flow chart of a method for generating a layout design of a memory device shown in FIG. 2, in accordance with some embodiments of the present disclosure.

Reference is made to FIG. 3. FIG. 3 is a flow chart of a method 300 for generating a layout design of a memory device AM shown in FIG. 2, in accordance with some embodiments of the present disclosure. Following illustrations of the method 300 in FIG. 3 with reference to the memory device AM in FIG. 2 include exemplary operations. However, the operations in FIG. 3 are not necessarily performed in the order shown. Alternatively stated, operations may be added, replaced, changed order, and/or eliminated as appropriate, in accordance with the spirit and scope of various embodiments of the present disclosure.

In operation S310, the word lines and the address lines are arranged in the memory device. For illustration, as shown in FIG. 2, the word lines WL and the address lines AL are arranged in the memory device AM. In some embodiments, the word lines are arranged in rows, the address lines are arranged in columns, and the word lines and the address lines are interacted to each other. In some embodiments, the vias are further arranged at the interaction with both of the word lines and the address lines, for coupling the word lines and the address lines to each other. For illustration, as shown in FIG. 2, the vias are arranged at the interaction with both of the word lines WL and the address lines AL.

In operation S320, first word lines and second word lines are grouped from the word lines. Alternatively stated, the word lines are grouped or split into two groups corresponding to the first word lines and the second word lines. For illustration, as shown in FIG. 2, the word lines WL are grouped into the groups G1 and G2, wherein the group G1 includes the word lines A1-D1 and A2-D2, and the group G2 includes the word lines A3-D3 and A4-D4.

The number and arrangement of the grouping word lines are given for illustrative purposes. Various numbers and arrangements of the grouping word lines are within the contemplated scope of the present disclosure. For instance, in various embodiments, the word lines are split into several groups, including, for example, one group including first word lines and another group including second word lines. In some other embodiments, the word lines are split into three groups (which is discussed with reference to FIG. 7). In some various embodiments, the word lines are split into four groups (which is discussed with reference to FIG. 8). Various configurations of grouping word lines are within the contemplated scope of the present disclosure.

Figure 4A:
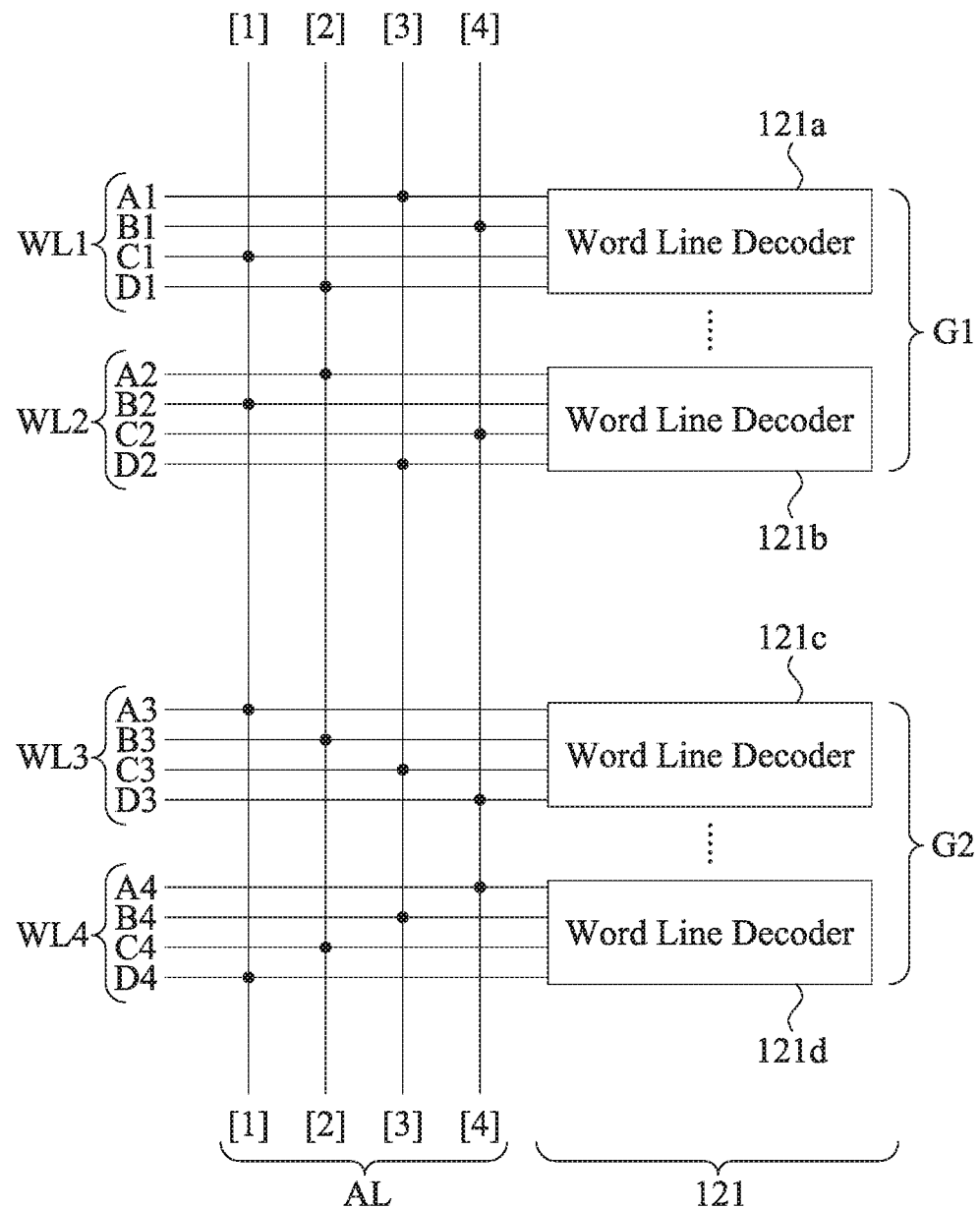
FIGS. 4A-4B are schematic diagrams of a memory device, to be operated in a method in FIG. 3, in accordance with some embodiments of the present disclosure.

Reference is now made to FIG. 4A. FIG. 4A is a schematic diagrams of a memory device AM, to be performed in operations including S310 and S320 in the method 300 in FIG. 3, in order to form the memory device AM shown in FIG. 2, in accordance with some embodiments of the present disclosure. With respect to the embodiments of FIG. 2, like elements in FIG. 4A are designated with the same reference numbers for ease of understanding.

For illustrated in FIG. 4A, sets of word lines WL1-WL4, including corresponding word lines A1-D1, A2-D2, A3-D3 and A4-D4 (which are also referenced as WL for simplicity), are arranged in rows and are coupled to the corresponding word line decoders 121a-121d. The address lines AL, including the address lines [1]-[4], are arranged in columns and are interacted with the word lines WL. The vias are arranged at the interaction with both of the word lines WL and the address lines AL, based on the circuit design of the memory device AM. Accordingly, the address lines AL are coupled through the vias to the word lines WL, and the word lines WL are coupled to the word line decoders 121.

Furthermore, with reference to FIG. 4A and the operation 320 in the method 300 in FIG. 3, the word lines WL are grouped into the group G1 and the group G2. Also, the corresponding word line decoders 121 are grouped into the group G1 and the group G2. For example, with reference to FIG. 4A, the word line decoders 121a, 121b and the corresponding word lines A1-D1, A2-D2 are grouped as the group G1. The word line decoders 121c, 121d and the corresponding word lines A3-D3, A4-D4 are grouped as the group G2. In some embodiments, the group G1 is disposed next to the group G2. Alternatively stated, the group G1 and the group G2 are abutting to each other.

Reference is now made back to FIG. 3. In operation S330, the address lines are twisted at at least one twisted spot. For illustration, as shown in FIG. 2, the address lines AL are twisted at at least one twisted spot including, for example, the twisted spot N. In some embodiments, the address lines are twisted with respect to rows and are flipped from the right to the left. In various embodiments, the address lines are twisted more than once, and have more than one twisted spot. For example, with reference to FIG. 7, the address lines have two twisted spots; and with reference to FIG. 8, the address lines have three twisted spots. In other various embodiments, plenty of the twisted spots are aligned with one column that is at a center column between the address lines.

In some embodiments, a number of the twisted times of address lines is based on a number of word line decoders coupled to the first word lines (indicated as a first number for simplicity) and a number of word line decoders coupled to the second word lines (indicated as a second number for simplicity). Alternatively stated, the address lines are twisted in a twisted number. The twisted number is determined according to numbers of word line decoders of corresponding groups that is grouped in operation S320. For example, in some other embodiments, when the first number is an even number, and the second number is an even number as well, the twisted number is more than one. In various embodiments, when one of the first number and the second number is an odd number, the twisted number is an odd number as well.

In operation S340, the vias on the twisted address lines are mirrored from the vias on the untwisted address lines. Alternatively stated, the vias are mirrored from the original vias disposed over both of the address lines and one of the word lines, with respect to a column disposed across the twisted spot. To explain in another way, the vias are flipped/twisted with the address lines together. Therefore, the word lines and the address lines have a same connection as that is operated before the operation S330. For illustration, as shown in FIG. 2, the vias are disposed over the twisted address lines AL and the word lines WL, by mirroring the vias from the vias on both of the untwisted address lines (not shown in FIG. 2) and the word lines WL of the group G1 to form the vias on the same.

Figure 4B:
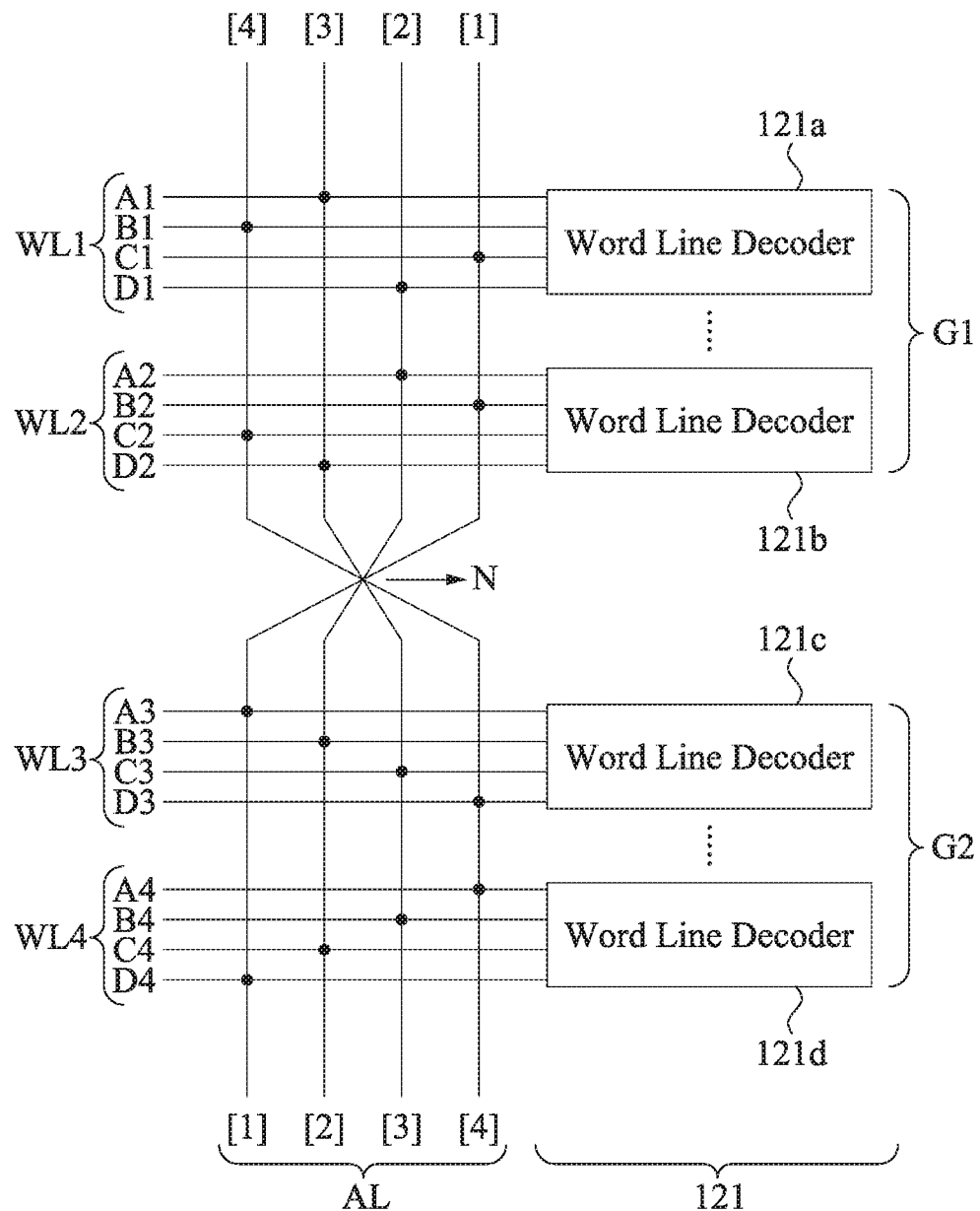

Reference is now made to FIG. 4B. FIG. 4B is a schematic diagrams of a memory device AM, to be performed in operations including S330 and S340 in the method 300 in FIG. 3, in order to from the memory device AM shown in FIG. 2, in accordance with some embodiments of the present disclosure. With respect to the embodiments of FIG. 2 or FIG. 4A, like elements in FIG. 4B are designated with the same reference numbers for ease of understanding.

For illustrated in FIG. 4B, the address lines AL are twisted at the twisted spot N, and the twisted spot N is disposed between the group G1 and the group G2, or also between the first word lines of the group G1 and the second word lines of the group G2, in another way of explanation.

Furthermore, the vias of the group G1 are disposed over the twisted address lines AL (i.e., the address lines AL in FIG. 4B) by mirroring vias of the group G1 disposed over the untwisted address lines (i.e., the address lines AL in FIG. 4A) and the corresponding word lines WL (e.g., the set of word lines WL1), with respect to a column (not shown in FIG. 4B) disposed across the twisted spot N, to form vias of the group G1 shown in FIG. 4B.

The number and arrangement of the twisted spot N are given for illustrative purposes. Various numbers and arrangements of the twisted spot N are within the contemplated scope of the present disclosure. For example, in various embodiments, the twisted spot N is disposed between the word lines of one group. In some other embodiments, a number of the twisted spot N is more than one and the twisted spots are disposed between word lines of different groups.

Reference is now made back to FIG. 3. In operation S350, part of the first word lines and the second word lines are cut off, to form the word lines included in the memory device. Alternatively stated, the redundant routings of both of the first word lines and the second word lines are removed, since the first word lines or the second word lines are coupled from the vias to the corresponding word line decoders. For illustration, as shown in FIG. 2, the word lines WL included in the memory device AM are generated by cutting off part of the word lines WL of the group G1 and the word lines WL of the group G2.

In operation S360, a layout design of the memory device is generated. The memory device includes the twisted address lines, the word lines and the word line decoders discussed above. For illustration, as shown in FIG. 2, the layout design of the memory device AM, including the twisted address lines AL, the word lines WL and the word line decoders 121, is generated.

Referring back to FIG. 2, in operations S350 and S360, the address lines AL are twisted at the twisted spot N, and each of the word lines WL that are coupled to the corresponding word line decoders 121 has a length which is different from each other. Furthermore, a total length of the word lines WL that are coupled to one of the address lines AL is equal to a total length of the word lines WL that are coupled to another one of the address lines AL.

Figure 5:
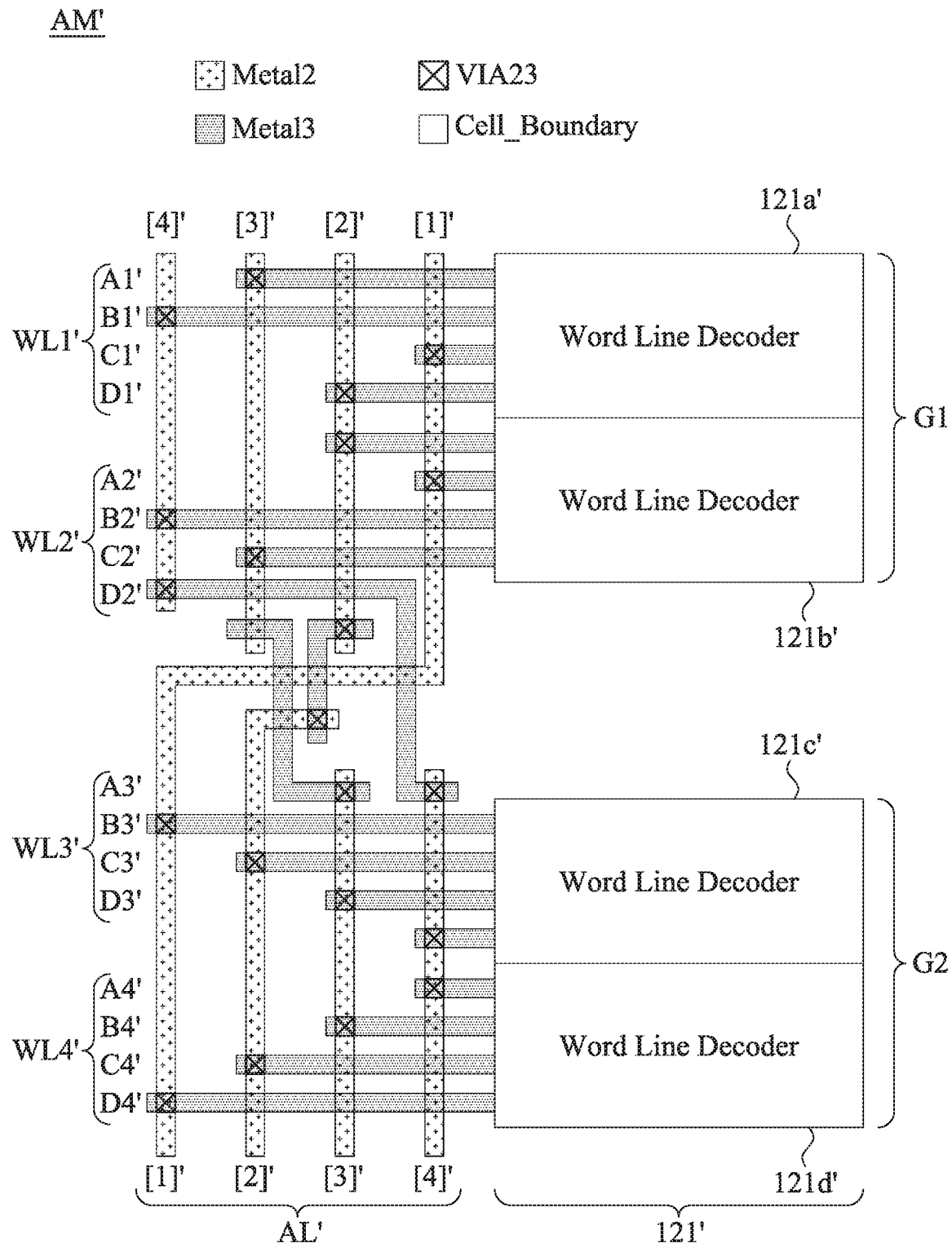
FIG. 5 is a layout diagram of a memory device shown in FIG. 2, in accordance with some embodiments of the present disclosure.

Reference is made to FIG. 5. FIG. 5 is a layout diagram AM' of a memory device AM shown in FIG. 2, and is also after operations including S310, S320, S330, S340 and S350, in accordance with some embodiments of the present disclosure.

For illustrated in FIG. 5, the layout diagram AM' includes word line decoders 121', sets of word lines WL1', WL2', WL3' and WL4' (which are referenced as WL' for simplicity), address lines AL' and vias (not labeled, which is illustrated as a square with a cross inside). In some embodiments, the layout diagram AM' corresponds to the memory device AM shown in FIG. 2; the word line decoders 121' correspond to the word line decoders 121 shown in FIG. 2; the word lines WL' correspond to the word lines WL shown in FIG. 2; the address lines AL' correspond to the address lines AL shown in FIG. 2; and the vias correspond to the vias shown in FIG. 2. In some embodiments, the memory device AM is implemented with the same layout as the layout diagram AM'.

The word line decoders 121' are formed in a cell boundary (indicated as "Cell Boundary" in FIG. 5) that is disposed in a second metal (M2, also indicated as "Metal2" in FIG. 5) layer, and the word line decoders 121' includes a word line decoder 121a', a word line decoder 121b', a word line decoder 121c' and a word line decoder 121d' that are arranged in columns.

The sets of word lines WL1', WL2', WL3' and WL4' are formed in the M2 layer and are coupled to the word line decoders 121' correspondingly. Specifically, the set of word lines WL1' includes word lines A1'-D1' and is coupled to the word line decoders 121a'; the set of word lines WL2' includes word lines A2'-D2' and is coupled to the word line decoders 121b'; the set of word lines WL3' includes word lines A3'-D3' and is coupled to the word line decoders 121c'; and the set of word lines WL4' includes word lines A4'-D4' and is coupled to the word line decoders 121d'.

The address lines AL' are twisted and formed in at least one metal layers. The at least one metal layer includes the M2 layer and a third metal (M3, also indicated as "Metal3" in FIG. 5) layer that is disposed above the M2 layer. The address lines AL' are interacted with the word lines WL'. The address lines AL' include an address line [1]' that is coupled through the vias to the word line C1, the word line B2, the word line A3, and the word line D4, respectively, wherein the vias are formed between the M2 layer and the M3 layer (also indicated as "VIA23" in FIG. 5), for coupling metal segments in M2 layer to metal segments in M3 layer. Furthermore, the address lines AL' include an address line [2]' that is coupled through the vias to the word line D1, the word line A2, the word line B3, and the word line C4, respectively; an address line [3]' that is coupled through the vias to the word line A1, the word line D2, the word line C3, and the word line B4, respectively; and an address line [4]' that is coupled through the vias to the word line B1, the word line C2, the word line D3, and the word line A4, respectively.

In some embodiments, one of the twisted address lines AL' is implemented by a twisted metal trace formed in the M2 layer. For example, with reference to FIG. 5, the address line [1]' is twisted and disposed in the M2 layer. In some embodiments, one of the twisted address lines AL' is implemented by several metal segments including at least one straight metal trace formed in the M2 layer and at least one twisted metal trace formed in the M3 layer. The twisted metal trace formed in the M3 layer is coupled through vias to the straight metal trace formed in the M2 layer, and the twisted metal trace is generated to form one of the twisted the address line AL'. For example, with reference to FIG. 5, the address line [2]' is twisted and includes a straight metal trace corresponds to a group G1 formed in the M2 layer, a twisted metal trace formed in the M3 layer, and an another straight metal trace corresponds to a group G2 formed in the M2 layer.

The above implementations of the layout diagram AM' are given for illustrative purposes. Various implementations of the layout diagram AM' are within the contemplated scope of the present disclosure. For example, in various embodiments, the M3 layer refers to any one of metal layers that is disposed above or below the M2 layer.

Figure 6:
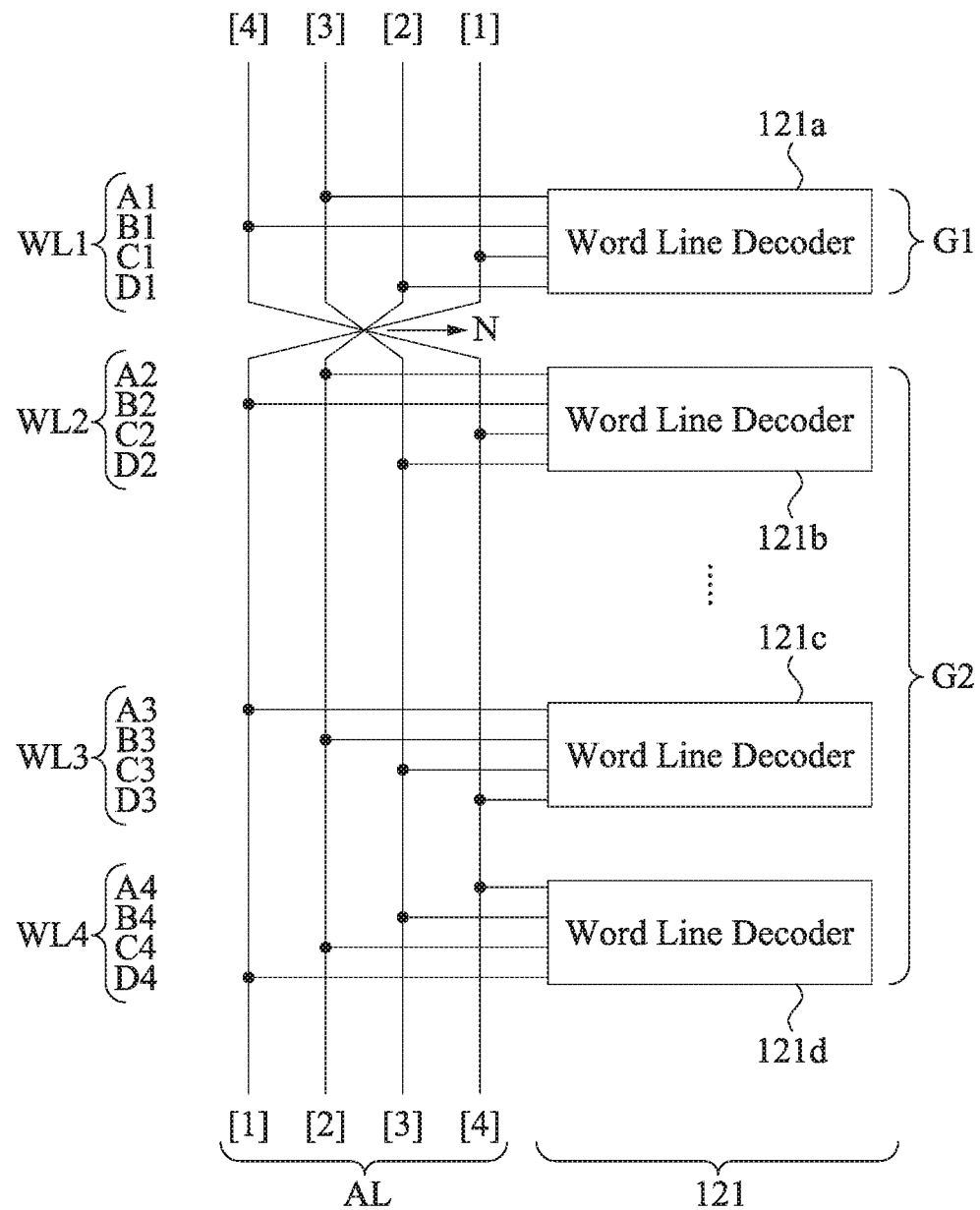
FIG. 6 is a schematic diagram of a memory device shown in FIG. 1, in accordance with some embodiments of the present disclosure.

Reference is now made to FIG. 6. FIG. 6 is a schematic diagram of a memory device AM corresponding to a part of the memory device 100 shown in FIG. 1, and is also another memory device AM corresponding to the memory device AM shown in FIG. 2, in accordance with some embodiments of the present disclosure. With respect to the embodiments of FIG. 1 or FIG. 2, like elements in FIG. 6 are designated with the same reference numbers for ease of understanding.

Compared to the embodiments illustrated in FIG. 2, the set of word lines WL1, including the word lines A1-D1 coupled to the word line decoder 121a, is split/grouped from other sets of word lines WL2-WL4 and is indicated as the group G1. The remaining sets of word lines WL2-WL4, including the word lines A2-D2, A3-D3, A4-D4 coupled to the word line decoders 121b, 121c, 121d correspondingly and other word lines (not shown) disposed between the word lines A2-D2 and A3-D3, are indicated as the group G2. Similar to the embodiment illustrated in FIG. 2, the address lines AL are twisted between the word lines of the group G1 and the word lines of the group G2, and have one twisted spot N disposed between the word lines A1-D1 of the group G1 and the word lines A2-D2 of the group G2.

In some embodiments, the sets of word lines WL1 and WL2 are grouped together as a first group, and the sets of word lines WL3 and WL4 are grouped together as a second group, and it is similar as a grouping result as illustrated in FIG. 2. The twisted spot N is disposed between the word lines of the first group, and no other twisted spots disposed between the word lines of the first group and the word lines of the second group, nor between the word lines of the second group. Alternatively stated, the address lines AL are twisted between the word lines of one of the groups, and are not twisted between the groups or between the word lines of the other one of the groups.

In some embodiments, with references to FIGS. 3 and 6, the first word lines correspond to the word lines A1-D1, and the second word lines correspond to the word lines A2-D2, A3-D3 and A4-D4. As such, a number of word line decoders 121 coupled to the first word lines is referred to as a number of word line decoder 121a, which is one and indicated as a first number for illustration; and a number of word line decoders 121 coupled to the second word lines is referred to as a number of word line decoders 121b-121d, which is three and indicated as a second number for illustration. The twisted number is determined based on both of the first number and the second number, and the twisted number is one.

Compared to the above approaches that a total length of word lines coupled to each of the address lines AL is different from one another and has a serious unbalance capacitance issues, in the embodiments of the present disclosure, for example with reference to FIG. 6, for each of the address lines AL, a total length of the word lines WL that are coupled to each of the address lines AL is substantially equal to one another. Accordingly, the parasitic capacitance corresponds to each of the address lines AL is also substantially equal to one another, and it has substantially balanced parasitic capacitance under a tolerance of the memory device AM.

Figure 7:
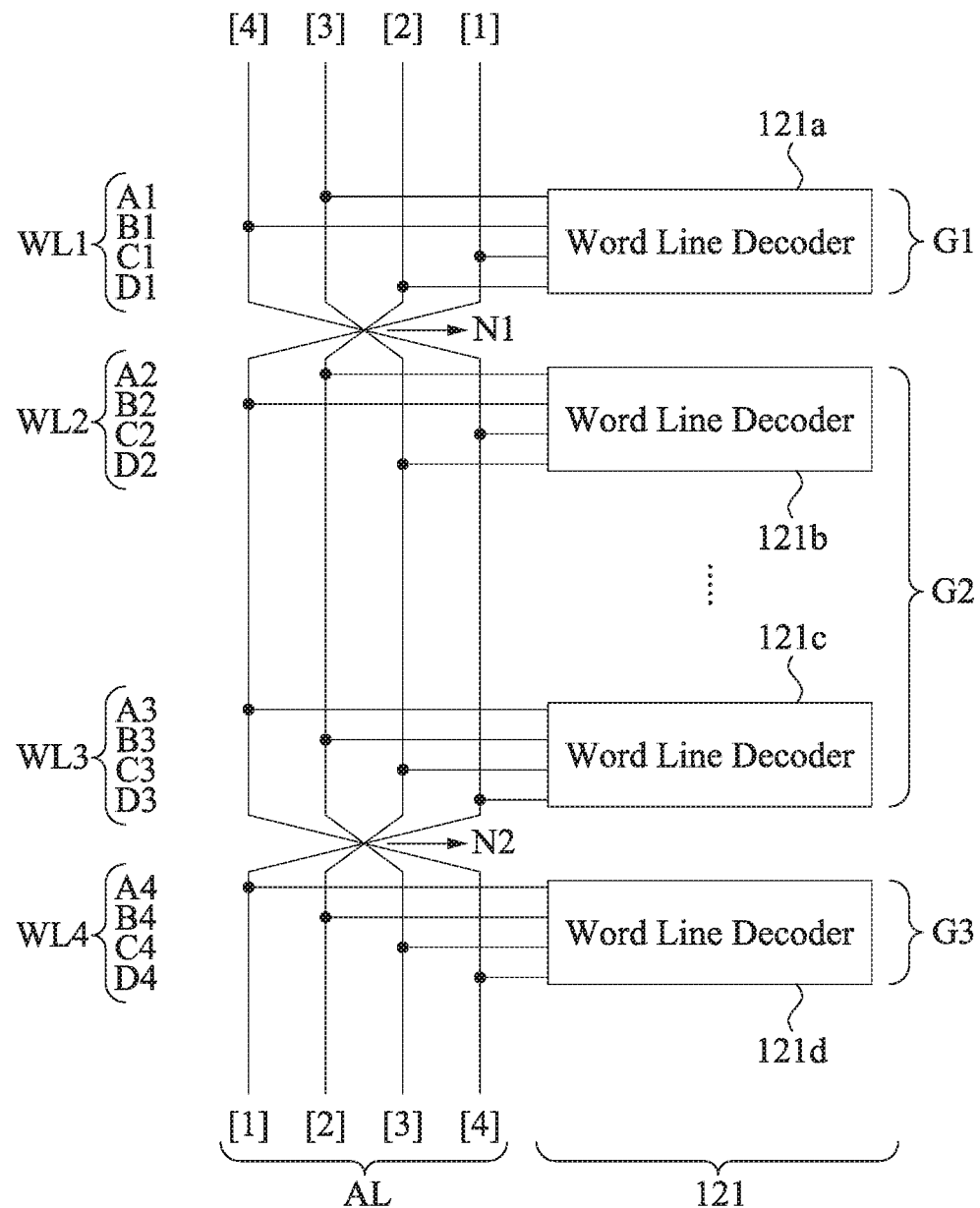
FIG. 7 is a schematic diagram of a memory device shown in FIG. 1, in accordance with some embodiments of the present disclosure.

Reference is now made to FIG. 7. FIG. 7 is a schematic diagram of a memory device AM corresponding to a part of the memory device 100 shown in FIG. 1, and is also another memory device AM corresponding to the memory device AM shown in FIG. 2 or FIG. 6, in accordance with some embodiments of the present disclosure. With respect to the embodiments of one of FIG. 1, FIG. 2 or FIG. 6, like elements in FIG. 7 are designated with the same reference numbers for ease of understanding.

Compared to the embodiments illustrated in FIG. 2, the set of word lines WL1, including the word lines A1-D1 coupled to the word line decoders 121a, is indicated as the group G1. The sets of word lines WL2 and WL3, including the word lines A2-D2 and A3-D3 coupled to the word line decoders 121b and 121c correspondingly and other word lines (not shown) disposed between the word lines A2-D2 and A3-D3, are indicated as the group G2 that is disposed next to the group G1. The remaining set of word line WL3, including the word lines A4-D4 coupled to the word line decoders 121d, is indicated as another group G3 that is disposed next to the group G2. Similar to the embodiment illustrated in FIG. 2, the address lines AL are twisted between the word lines of the group G1 and the word lines of the group G2, and are further twisted between the word lines of the group G2 and the word lines of the group G3. Accordingly, the address lines AL have one twisted spot N1 disposed between the word lines A1-D1 of the group G1 and the word lines A2-D2 of the group G2, and have another one twisted spot N2 disposed between the word lines A3-D3 of the group G2 and the word lines A4-D4 of the group G3.

In some embodiments, with references to FIGS. 3 and 7, the word lines WL are split into three groups, including, for example, the groups G1-G3. As such, a number of word line decoders 121 coupled to the first word lines is referred to as a number of word line decoder 121a, which is one and indicated as a first number for illustration; a number of word line decoders 121 coupled to the second word lines is referred to as a number of word line decoders 121b-121c, which is two and indicated as a second number for illustration; and a number of word line decoders 121 coupled to third word lines is referred to as a number of word line decoder 121d, which is one and indicated as a third number for illustration. The twisted number is determined based on all of the first number, the second number and the third number, and the twisted number is two.

Figure 8:
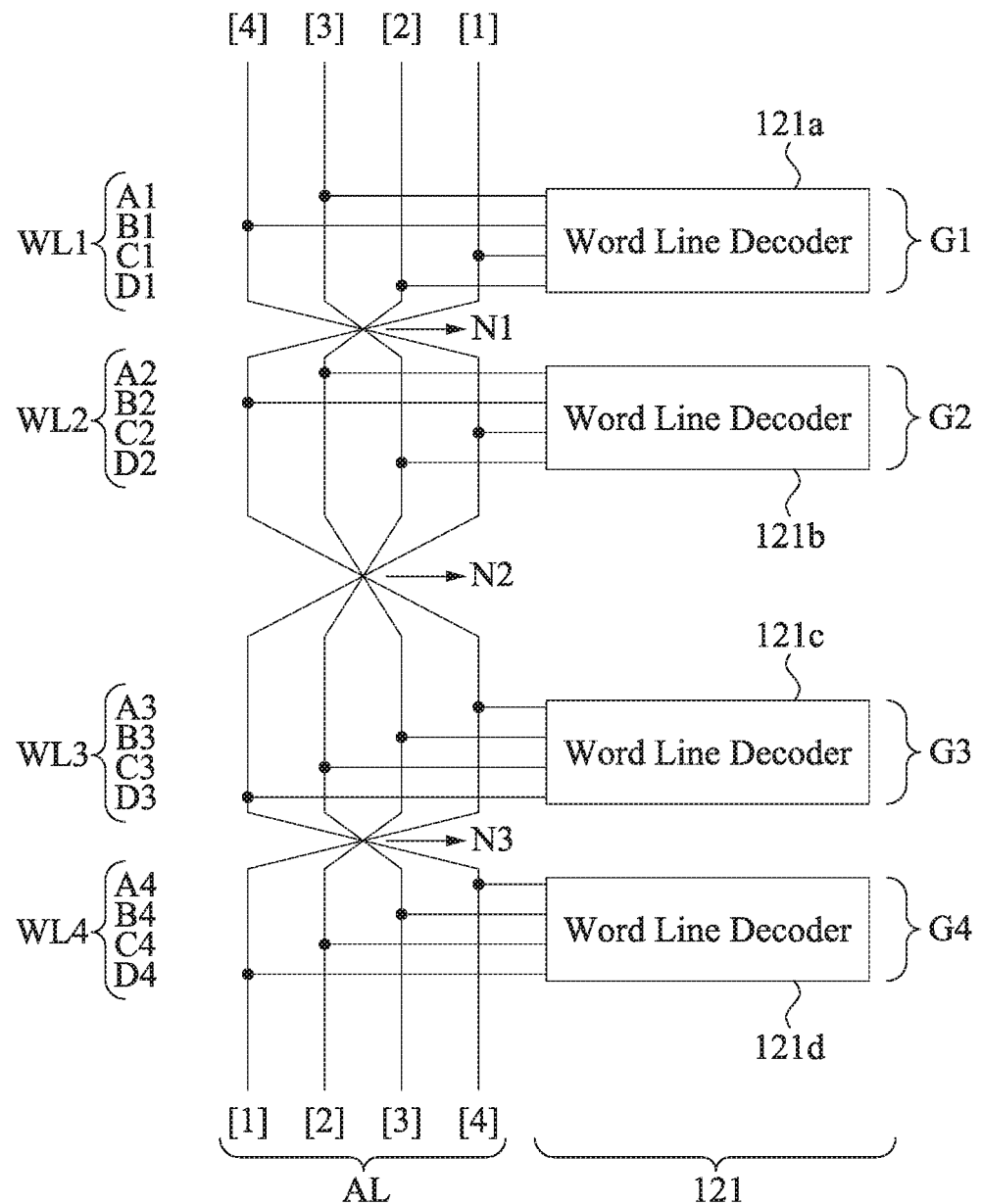
FIG. 8 is a schematic diagram of a memory device shown in FIG. 1, in accordance with some embodiments of the present disclosure.

Reference is now made to FIG. 8. FIG. 8 is a schematic diagram of a memory device AM corresponding to a part of the memory device 100 shown in FIG. 1, and is also another memory device AM corresponding to the memory device AM shown in at least one of FIG. 2 or FIGS. 6-7, in accordance with some embodiments of the present disclosure. With respect to the embodiments of one of FIG. 1, FIG. 2 or FIGS. 6-7, like elements in FIG. 8 are designated with the same reference numbers for ease of understanding.

Compared to the embodiments illustrated in FIG. 2, the set of word lines WL1, including the word lines A1-D1 coupled to the word line decoders 121a, is indicated as the group G1. The set of word lines WL2, including the word lines A2-D2 coupled to the word line decoder 121b, is indicated as the group G2 that is disposed next to the group G1. The set of word lines WL3, including the word lines A3-D3 coupled to the word line decoder 121c, is indicated as another group G3 that is disposed next to the group G2. The set of word line WL4, including the word lines A4-D4 coupled to the word line decoders 121d, is indicated as other group G4 that is disposed next to the group G3. Similar to the embodiment illustrated in FIG. 2, the address lines AL are twisted several times and twisted at including, for example, between the word lines of the group G1 and the word lines of the group G2, between the word lines of the group G2 and the word lines of the group G3, and between the word lines of the group G3 and the word lines of the group G4. Accordingly, the address lines AL have one twisted spot N1 disposed between the word lines A1-D1 of the group G1 and the word lines A2-D2 of the group G2; another one twisted spot N2 disposed between the word lines A2-D2 of the group G2 and the word lines A3-D3 of the group G3; and the other one twisted spot N3 disposed between the word lines A3-D3 of the group G3 and the word lines A4-D4 of the group G4.

In some embodiments, with references to FIGS. 3 and 8, the word lines WL are split into four groups, including, for example, the groups G1-G4. Similar to the embodiments illustrated in FIG. 7, the twisted number is determined according to numbers of word line decoders 121 of the corresponding groups G1-G4.

Figure 9:
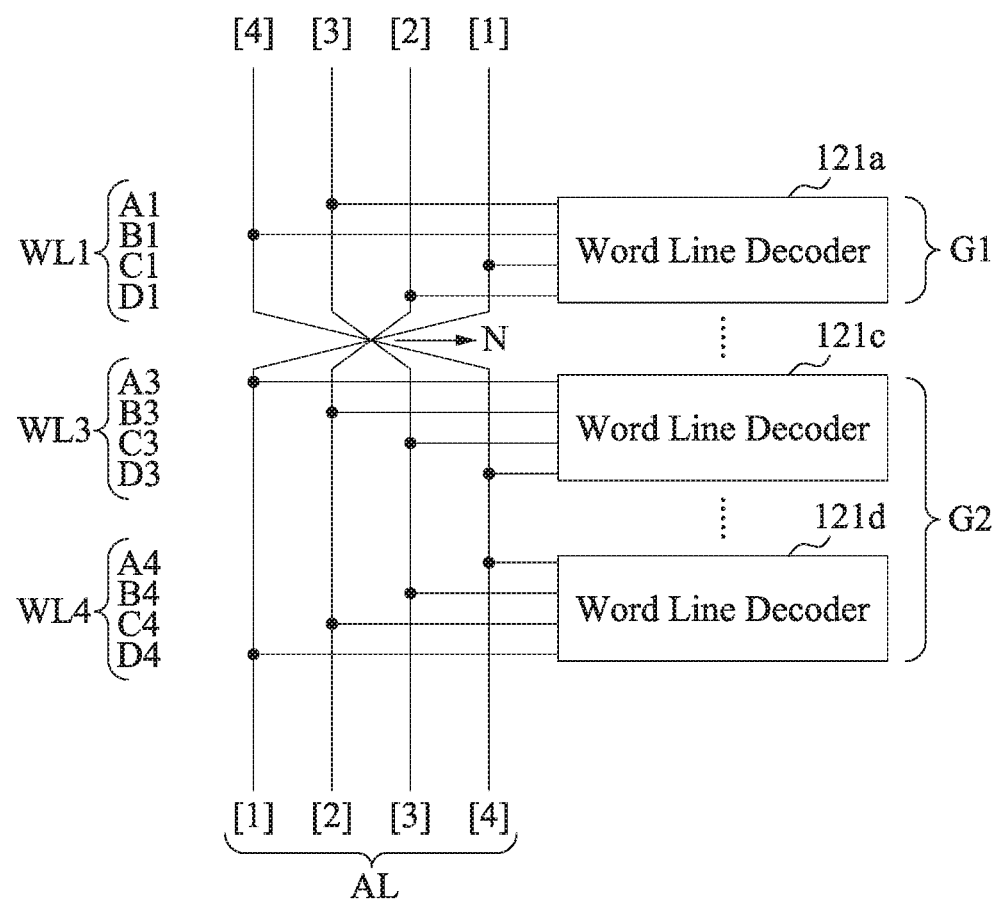
FIG. 9 is a schematic diagram of a memory device shown in FIG. 1, in accordance with some embodiments of the present disclosure.

Reference is now made to FIG. 9. FIG. 9 is a schematic diagram of a memory device AM corresponding to a part of the memory device 100 shown in FIG. 1, and is also another memory device AM corresponding to the memory device AM shown in at least one of FIG. 2 or FIGS. 6-8, in accordance with some embodiments of the present disclosure. With respect to the embodiments of one of FIG. 1, FIG. 2 or FIGS. 6-8, like elements in FIG. 9 are designated with the same reference numbers for ease of understanding.

Compared to the embodiments illustrated in FIG. 2, only the set of word lines WL1, including the word lines A1-D1 coupled to the word line decoders 121a, is indicated as the group G1. Similarly, the remaining sets of word line WL3 and WL4, including the word lines A3-D3 and A4-D4 coupled to the word line decoders 121c and 121d correspondingly, are indicated as another group G2 that is disposed next to the group G1.

In some embodiments, with references to FIGS. 3 and 9, the first word lines correspond to the word lines A1-D1, and the second word lines correspond to the word lines A3-D3 and A4-D4. As such, a number of word line decoders 121 coupled to the first word lines is referred to as a number of word line decoder 121a, which is one and indicated as a first number for illustration; and a number of word line decoders 121 coupled to the second word lines is referred to as a number of word line decoders 121c and 121d, which is two and indicated as a second number for illustration. The twisted number is determined based on both of the first number and the second number, and the twisted number is one.

Figure 10:
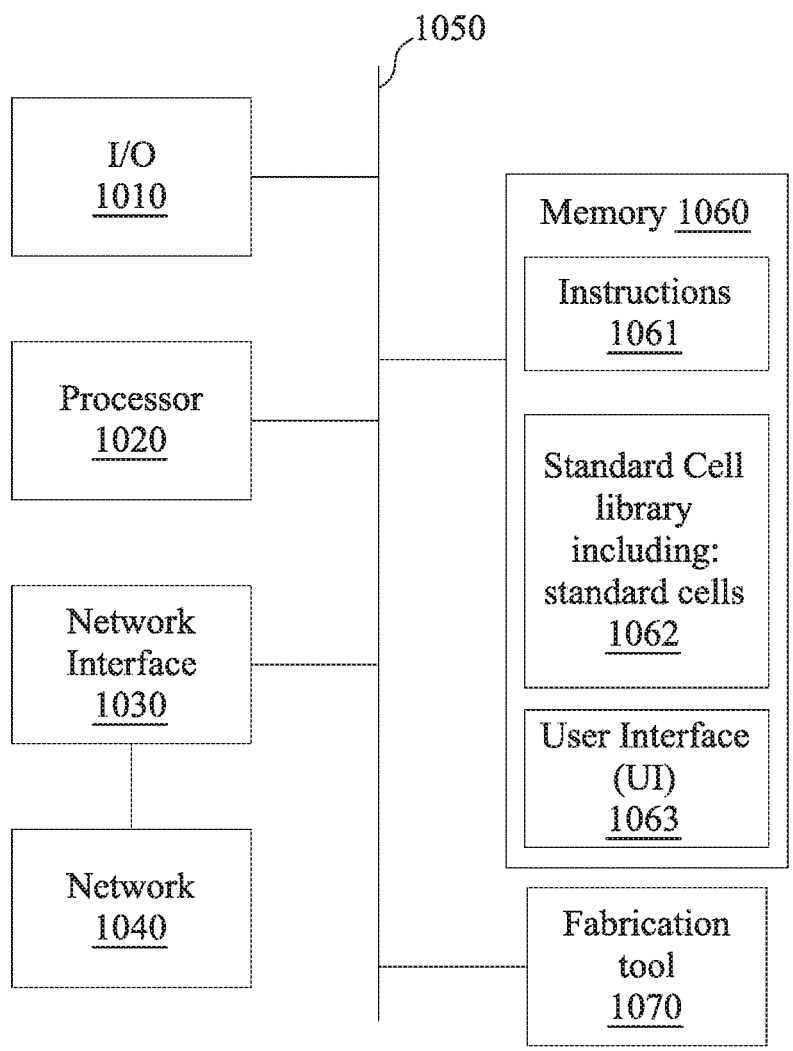
FIG. 10 is a block diagram of a system for designing an IC layout design, in accordance with some embodiments of the present disclosure.

Reference is now made to FIG. 10. FIG. 10 is a block diagram of an electronic design automation (EDA) system 1000 for designing the integrated circuit layout design, in accordance with some embodiments of the present disclosure. EDA system 1000 is configured to implement one or more operations of the method 300 disclosed in FIG. 3, and further explained in conjunction with FIGS. 4A-9. In some embodiments, EDA system 1000 includes an APR system.

In some embodiments, EDA system 1000 is a general purpose computing device including a hardware processor 1020 and a non-transitory, computer-readable storage medium 1060. Storage medium 1060, amongst other things, is encoded with, i.e., stores, computer program code (instructions) 1061, i.e., a set of executable instructions. Execution of instructions 1061 by hardware processor 1020 represents (at least in part) an EDA tool which implements a portion or all of, e.g., the method 300.

The processor 1020 is electrically coupled to computer-readable storage medium 1060 via a bus 1050. The processor 1020 is also electrically coupled to an I/O interface 1010 and an fabrication tool 1070 by bus 1050. A network interface 1030 is also electrically connected to processor 1020 via bus 1050. Network interface 1030 is connected to a network 1040, so that processor 1020 and computer-readable storage medium 1060 are capable of connecting to external elements via network 1040. The processor 1020 is configured to execute computer program code 1061 encoded in computer-readable storage medium 1060 in order to cause EDA system 1000 to be usable for performing a portion or all of the noted processes and/or methods. In one or more embodiments, processor 1020 is a central processing unit (CPU), a multi-processor, a distributed processing system, an application specific integrated circuit (ASIC), and/or a suitable processing unit.

In one or more embodiments, computer-readable storage medium 1060 is an electronic, magnetic, optical, electromagnetic, infrared, and/or a semiconductor system (or apparatus or device). For example, computer-readable storage medium 1060 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1060 includes a compact disk-read only memory (CD-ROM), a compact disk-read/write (CD-R/W), and/or a digital video disc (DVD).

In one or more embodiments, storage medium 1060 stores computer program code 1061 configured to cause EDA system 1000 (where such execution represents (at least in part) the EDA tool) to be usable for performing a portion or all of the noted processes and/or methods. In one or more embodiments, storage medium 1060 also stores information which facilitates performing a portion or all of the noted processes and/or methods. In one or more embodiments, storage medium 1060 stores library 1062 of standard cells including such standard cells as disclosed herein, for example, a memory cell included in the array of memory cells 100a or 100b discussed above with respect to FIG. 1.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1020.

EDA system 1000 also includes network interface 1030 coupled to processor 1020. Network interface 1030 allows EDA system 1000 to communicate with network 1040, to which one or more other computer systems are connected. Network interface 1030 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1000.

EDA system 1000 also includes the fabrication tool 1070 coupled to the processor 1020. The fabrication tool 1070 is configured to fabricate integrated circuits, including, for example, the memory device 100 implemented by an integrated circuit illustrated in FIG. 1, based on the design files processed by the processor 1020 and/or the IC layout designs as discussed above.

EDA system 1000 is configured to receive information through I/O interface 1010. The information received through I/O interface 1010 includes one or more of instructions, data, design rules, libraries of standard cells, and/or other parameters for processing by processor 1020. The information is transferred to processor 1020 via bus 1050. EDA system 1000 is configured to receive information related to a UI through I/O interface 1010. The information is stored in computer-readable medium 1060 as user interface (UI) 1063.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 11:
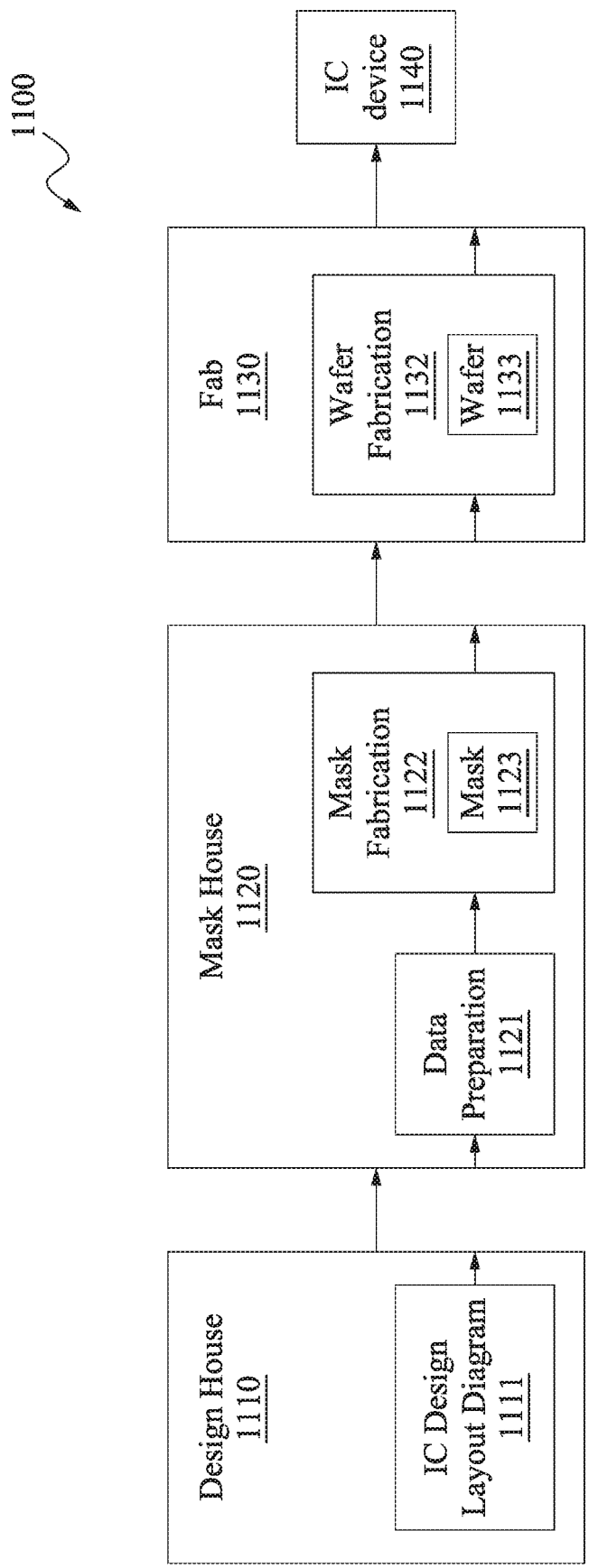
FIG. 11 is a block diagram of an IC manufacturing system, and an IC manufacturing flow associated therewith, in accordance with some embodiments of the present disclosure.

FIG. 11 is a block diagram of IC manufacturing system 1100, and an IC manufacturing flow associated therewith, in accordance with some embodiments of the present disclosure. In some embodiments, based on a layout diagram, at least one of (A) one or more semiconductor masks or (B) at least one component in a layer of a semiconductor integrated circuit is fabricated using IC manufacturing system 1100.

In FIG. 11, IC manufacturing system 1100 includes entities, such as a design house 1110, a mask house 1120, and an IC manufacturer/fabricator ("fab") 1130, that interact with one another in the design, development, and manufacturing cycles and/or services related to manufacturing an IC device 1140. The entities in IC manufacturing system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1110, mask house 1120, and IC fab 1130 is owned by a single larger company. In some embodiments, two or more of design house 1110, mask house 1120, and IC fab 1130 coexist in a common facility and use common resources.

Design house (or design team) 1110 generates an IC design layout diagram 1111. IC design layout diagram 1111 includes various geometrical patterns, for example, an IC layout design depicted in FIG. 4A and/or FIG. 4B, designed for an IC device 1140, for example, memory device AM, discussed above with respect to FIG. 2, FIG. 4A, FIG. 4B, FIG. 6, FIG. 7, FIG. 8 and/or FIG. 9. The geometrical patterns correspond to patterns of metal, oxide, or semiconductor layers that make up the various components of IC device 1140 to be fabricated. The various layers combine to form various IC features. For example, a portion of IC design layout diagram 1111 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1110 implements a proper design procedure to form IC design layout diagram 1111. The design procedure includes one or more of logic design, physical design or place and route. IC design layout diagram 1111 is presented in one or more data files having information of the geometrical patterns. For example, IC design layout diagram 1111 can be expressed in a GDSII file format or DFII file format.

Mask house 1120 includes mask data preparation 1121 and mask fabrication 1122. Mask house 1120 uses IC design layout diagram 1111 to manufacture one or more masks 1123 to be used for fabricating the various layers of IC device 1140 according to IC design layout diagram 1111. Mask house 1120 performs mask data preparation 1121, where IC design layout diagram 1111 is translated into a representative data file ("RDF"). Mask data preparation 1121 provides the RDF to mask fabrication 1122. Mask fabrication 1122 includes a mask writer. A mask writer converts the RDF to an image on a substrate, such as a mask (reticle) 1123 or a semiconductor wafer 1133. The IC design layout diagram 1111 is manipulated by mask data preparation 1121 to comply with particular characteristics of the mask writer and/or requirements of IC fab 1130. In FIG. 11, data preparation 1121 and mask fabrication 1122 are illustrated as separate elements. In some embodiments, data preparation 1121 and mask fabrication 1122 can be collectively referred to as mask data preparation.

In some embodiments, data preparation 1121 includes optical proximity correction (OPC) which uses lithography enhancement techniques to compensate for image errors, such as those that can arise from diffraction, interference, other process effects and the like. OPC adjusts IC design layout diagram 1111. In some embodiments, data preparation 1121 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1121 includes a mask rule checker (MRC) that checks the IC design layout diagram 1111 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1111 to compensate for limitations during mask fabrication 1122, which may undo part of the modifications performed by OPC in order to meet mask creation rules.

In some embodiments, data preparation 1121 includes lithography process checking (LPC) that simulates processing that will be implemented by IC fab 1130 to fabricate IC device 1140. LPC simulates this processing based on IC design layout diagram 1111 to create a simulated manufactured device, such as IC device 1140. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1111.

It should be understood that the above description of data preparation 1121 has been simplified for the purposes of clarity. In some embodiments, data preparation 1121 includes additional features such as a logic operation (LOP) to modify the IC design layout diagram 1111 according to manufacturing rules. Additionally, the processes applied to IC design layout diagram 1111 during data preparation 1121 may be executed in a variety of different orders.

After data preparation 1121 and during mask fabrication 1122, a mask 1123 or a group of masks 1123 are fabricated based on the modified IC design layout diagram 1111. In some embodiments, mask fabrication 1122 includes performing one or more lithographic exposures based on IC design layout diagram 1111. In some embodiments, an electron-beam (e-beam) or a mechanism of multiple e-beams is used to form a pattern on a mask (photomask or reticle) 1123 based on the modified IC design layout diagram 1111. Mask 1123 can be formed in various technologies. In some embodiments, mask 1123 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1123 includes a transparent substrate (for example, fused quartz) and an opaque material (for example, chromium) coated in the opaque regions of the binary mask. In another example, mask 1123 is formed using a phase shift technology. In a phase shift mask (PSM) version of mask 1123, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1122 is used in a variety of processes. For example, such a mask(s) is used in an ion implantation process to form various doped regions in semiconductor wafer 1133, in an etching process to form various etching regions in semiconductor wafer 1133, and/or in other suitable processes.

IC fab 1130 includes wafer fabrication 1132. IC fab 1130 is an IC fabrication business that includes one or more manufacturing facilities for the fabrication of a variety of different IC products. In some embodiments, IC fab 1130 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1130 uses mask(s) 1123 fabricated by mask house 1120 to fabricate IC device 1140. Thus, IC fab 1130 at least indirectly uses IC design layout diagram 1111 to fabricate IC device 1140. In some embodiments, semiconductor wafer 1133 is fabricated by IC fab 1130 using mask(s) 1123 to form IC device 1140. In some embodiments, the IC fabrication includes performing one or more lithographic exposures based at least indirectly on IC design layout diagram 1111. Semiconductor wafer 1133 includes a silicon substrate or other proper substrate having material layers formed thereon. Semiconductor wafer 1133 further includes one or more of various doped regions, dielectric features, multi-level interconnects, and the like (formed at subsequent manufacturing steps).

In some embodiments, a memory device is disclosed. The memory device includes a first plurality of program lines of a first group, a second plurality of program lines of a second group, and a plurality of address lines. The second plurality of program lines are disposed next to and are parallel to the first plurality of program lines. The plurality of address lines are coupled to the first plurality of program lines and the second plurality of program lines respectively. The plurality of address lines are twisted and are intersected with the first plurality of program lines and the second plurality of program lines in a layout view. At least two adjacent program lines of the first plurality of program lines or the second plurality of program lines have lengths different from each other.

In some embodiments, the plurality of address lines are twisted at at least one twisted spot. The at least one twisted spot is at least disposed between the first plurality of program lines and the second plurality of program lines.

In some embodiments, each of the first plurality of program lines has a length different from one another. Each of the second plurality of program lines has a length different from one another. A total length of the first plurality of program lines and the second plurality of program lines that are coupled to one of the plurality of address lines is equal to a total length of the first plurality of program lines and the second plurality of program lines that are coupled to another one of the plurality of address lines.

In some embodiments, the memory device further includes a plurality of vias. The plurality of vias are disposed over the first plurality of program lines and the plurality of address lines in a layout view, and disposed over the second plurality of program lines and the plurality of address lines in a layout view. The first plurality of program lines extend from the plurality of vias to a first plurality of program decoders of the first group, and each of the first plurality of program lines has a length different from one another.

In some embodiments, the second plurality of program lines extend from the plurality of vias to a second plurality of program decoders of the second group that is disposed next to the first plurality of program decoders. A first length of one of the second plurality of program lines is different from a second length of another one of the second plurality of program lines. The first length is equals to a third length of one of the first plurality of program lines.

In some embodiments, the memory device further includes a first plurality of program decoders of the first group and a second plurality of program decoders of the second group. The first plurality of program decoders are coupled to the first plurality of program lines. The second plurality of program decoders are coupled to the second plurality of program lines, and are disposed next to the first plurality of program decoders. The plurality of address lines are twisted at least between the first plurality of program lines and the second plurality of program lines.

In some embodiments, the plurality of address lines are twisted in a twisted number. The twisted number is determined based on a number of the first plurality of program decoders and a number of the second plurality of program decoders.

Also disclosed is a memory device which includes an array of memory cells, a first plurality of program lines, a second plurality of program lines, and a plurality of address lines. The array of memory cells is arranged in rows and columns. The second plurality of program lines extend along the rows and are coupled through a second plurality of program decoders to the array of memory cells. The second plurality of program lines are disposed next to the first plurality of program lines. The first plurality of program lines extend along the rows and are coupled through a first plurality of program decoders to the array of memory cells. The plurality of address lines substantially extend along the columns and are coupled through the first plurality of program lines and the second plurality of program lines to the first plurality of program decoders and the second plurality of program decoders, respectively. The plurality of address lines are twisted at least between the first plurality of program lines and the second plurality of program lines. At least two adjacent program lines of the first plurality of program lines or the second plurality of program lines have lengths that are different from each other.

In some embodiments, each of the first plurality of program lines has a length different from one another. Each the second plurality of program lines has a length different from one another. A total length of the first plurality of program lines and the second plurality of program lines that are coupled to one of the plurality of address lines is equal to a total length of the first plurality of program lines and the second plurality of program lines that are coupled to another one of the plurality of address lines.

In some embodiments, the memory device further includes a plurality of vias. The plurality of vias are disposed over the first plurality of program lines and the plurality of address lines in a layout view. The plurality of address lines are coupled through the plurality of vias to the first plurality of program lines. The first plurality of program lines extend from the plurality of vias to the first plurality of program decoders. Each of the first plurality of program lines has a length different from one another.

In some embodiments, the plurality of address lines are twisted in a twisted number. The twisted number is determined based on a number of the first plurality of program decoders and a number of the second plurality of program decoders.

In some embodiments, the first plurality of program lines include first program lines and second program lines. The first program lines are coupled to a first program decoder of the first plurality of program decoders. The second program lines are coupled to a second program decoder of the first plurality of program decoders that is disposed next to the first program decoder. The plurality of address lines are further twisted between the first program lines and the second program lines.

In some embodiments, a first length of one of the first plurality of program lines is different from a second length of another one of the first plurality of program lines. The first length is equals to a third length of one of the second plurality of program lines.

Also disclosed is a method which includes: arranging a first plurality of program lines of program lines coupled through a first plurality of program decoders to an array of memory cells arranged in rows and columns, wherein the first plurality of program lines extend along the rows; arranging a second plurality of program lines of the program lines extending along the rows and coupled through a second plurality of program decoders to the array of memory cells; arranging a plurality of address lines substantially extending along the columns and coupled to the first plurality of program lines and the second plurality of program lines respectively; twisting the plurality of address lines at at least one twisted spot, wherein the at least one twisted spot is at least disposed between the first plurality of program lines and the second plurality of program lines; and generating a layout diagram of a memory device that comprises the first plurality of program lines, the second plurality of program lines and the plurality of address lines. At least two adjacent program lines of the first plurality of program lines or the second plurality of program lines have lengths different from each other.

In some embodiments, the operation of twisting the plurality of address lines includes arranging a first plurality of vias disposed over the plurality of address lines and the first plurality of program lines in a layout view, by mirroring a second plurality of vias disposed over the untwisted plurality of address lines and the first plurality of program lines in a layout view, with respect to a column disposed across the at least one twisted spot, to form the first plurality of vias.

In some embodiments, the method further includes: cutting part of the first plurality of program lines to form the first plurality of program lines extending from a plurality of vias to the first plurality of program decoders.

In some embodiments, the method further includes: grouping the program lines into the first plurality of program lines and the second plurality of program lines; and determining a number of the at least one twisted spot, based on a number of the first plurality of program decoders and a number of the second plurality of program decoders. The at least one twisted spot is further disposed between the first plurality of program lines, or disposed between the second plurality of program lines.

In some embodiments, when the number of the first plurality of program decoders is an even number, and the number of the second plurality of program decoders is an even number, the at least one twisted spot includes a plurality of twisted spots. The plurality of twisted spots are further disposed between each of groups of the first plurality of program lines corresponding to each of the first plurality of program decoders.

In some embodiments, each of the first plurality of program lines has a length different from one another. Each of the second plurality of program lines has a length different from one another. A total length of the first plurality of program lines and the second plurality of program lines that are coupled to one of the plurality of address lines is equal to a total length of the first plurality of program lines and the second plurality of program lines that are coupled to another one of the plurality of address lines.

In some embodiments, the method further includes: fabricating, based on the layout diagram, at least one of (A) one or more semiconductor masks or (B) at least one component in a layer of a semiconductor integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
arranging a first plurality of program lines coupled through a first plurality of program decoders to an array of memory cells arranged in rows and columns, wherein the first plurality of program lines extend along the rows;

arranging a second plurality of program lines extending along the rows and coupled through a second plurality of program decoders to the array of memory cells;

arranging a plurality of address lines substantially extending along the columns and coupled to the first plurality of program lines and the second plurality of program lines respectively;

twisting the plurality of address lines at at least one twisted spot, wherein the at least one twisted spot is at least disposed between the first plurality of program lines and the second plurality of program lines; and generating a layout diagram of a memory device that comprises the first plurality of program lines, the second plurality of program lines and the plurality of address lines, wherein at least two adjacent program lines of the first plurality of program lines or the second plurality of program lines have lengths different from each other.

2. The method of claim 1, wherein the twisting the plurality of address lines comprises:

arranging a first plurality of vias disposed over the plurality of address lines and the first plurality of program lines in a layout view, by mirroring a second plurality of vias disposed over the untwisted plurality of address lines and the first plurality of program lines in a layout view, with respect to a column disposed across the at least one twisted spot, to form the first plurality of vias.

3. The method of claim 1, further comprising:

cutting part of the first plurality of program lines to form the first plurality of program lines extending from a plurality of vias to the first plurality of program decoders.

4. The method of claim 1, further comprising:

determining a number of the at least one twisted spot, based on a number of the first plurality of program decoders and a number of the second plurality of program decoders, wherein the at least one twisted spot is further disposed between the first plurality of program lines, or disposed between the second plurality of program lines.

5. The method of claim 4, wherein when the number of the first plurality of program decoders is an even number, and the number of the second plurality of program decoders is an even number, the at least one twisted spot comprises a plurality of twisted spots, and the plurality of twisted spots are further disposed between each of groups of the first plurality of program lines corresponding to each of the first plurality of program decoders.

6. The method of claim 1, wherein each of the first plurality of program lines has a length different from one another, each of the second plurality of program lines has a length different from one another, and a total length of the first plurality of program lines and the second plurality of program lines that are coupled to one of the plurality of address lines is equal to a total length of the first plurality of program lines and the second plurality of program lines that are coupled to another one of the plurality of address lines.

7. The method of claim 1, further comprising:

fabricating, based on the layout diagram, at least one of (A) one or more semiconductor masks or (B) at least one component in a layer of a semiconductor integrated circuit.

8. A method, comprising:

arranging a first plurality of program lines of a first group;

arranging a second plurality of program lines of a second group, wherein the second plurality of program lines are disposed next to and are parallel to the first plurality of program lines;

arranging a plurality of address lines coupled to the first plurality of program lines and the second plurality of program lines respectively, wherein the plurality of address lines are intersected with the first plurality of program lines and the second plurality of program lines in a layout view;

twisting the plurality of address lines; and generating a layout diagram of a memory device that comprises the first plurality of program lines, the second plurality of program lines and the plurality of address lines, wherein at least two adjacent program lines of the first plurality of program lines or the second plurality of program lines have lengths different from each other.

9. The method of claim 8, wherein the twisting the plurality of address lines comprises:

twisting the plurality of address lines at at least one twisted spot, and the at least one twisted spot is at least disposed between the first plurality of program lines and the second plurality of program lines.

10. The method of claim 8, wherein each of the first plurality of program lines has a length different from one another, each of the second plurality of program lines has a length different from one another, and a total length of the first plurality of program lines and the second plurality of program lines that are coupled to one of the plurality of address lines is equal to a total length of the first plurality of program lines and the second plurality of program lines that are coupled to another one of the plurality of address lines.

11. The method of claim 8, further comprising:

arranging a plurality of vias that are disposed over the first plurality of program lines and the plurality of address lines in the layout view, and that are disposed over the second plurality of program lines and the plurality of address lines in the layout view, wherein the first plurality of program lines extend from the plurality of vias to a plurality of first program decoders of the first group, and each of the first plurality of program lines has a length different from one another.

12. The method of claim 11, wherein the second plurality of program lines extend from the plurality of vias to a plurality of second program decoders of the second group that is disposed next to the first plurality of program decoders, a first length of one of the second plurality of program lines is different from a second length of another one of the second plurality of program lines, and the first length is equal to a third length of one of the first plurality of program lines.

13. The method of claim 8, further comprising:

arranging a first plurality of program decoders coupled to the first plurality of program lines; and arranging a second plurality of program decoders coupled to the second plurality of program lines and disposed next to the first plurality of program decoders, wherein the plurality of address lines are twisted at least between the first plurality of program lines and the second plurality of program lines.

14. The method of claim 13, wherein the plurality of address lines are twisted in a twisted number, and the twisted number is determined based on a number of the first plurality of program decoders and a number of the second plurality of program decoders.

15. A method, comprising:

arranging an array of memory cells in rows and columns;

arranging a first plurality of program lines extending along the rows and coupled through a first plurality of program decoders to the array of memory cells;

arranging a second plurality of program lines extending along the rows and coupled through a second plurality of program decoders to the array of memory cells, wherein the second plurality of program lines are disposed next to the first plurality of program lines;

arranging a plurality of address lines substantially extending along the columns and coupled through the first plurality of program lines and the second plurality of program lines to the first plurality of program decoders and the second plurality of program decoders, respectively;

twisting the plurality of address lines at least between the first plurality of program lines and the second plurality of program lines; and generating a layout diagram of a memory device that comprises the first plurality of program lines, the second plurality of program lines and the plurality of address lines, wherein at least two adjacent program lines of the first plurality of program lines or the second plurality of program lines have lengths that are different from each other.

16. The method of claim 15, wherein each of the first plurality of program lines has a length different from one another, each of the second plurality of program lines has a length different from one another, and a total length of the first plurality of program lines and the second plurality of program lines that are coupled to one of the plurality of address lines is equal to a total length of the first plurality of program lines and the second plurality of program lines that are coupled to another one of the plurality of address lines.

17. The method of claim 15, further comprising:

arranging a plurality of vias over the first plurality of program lines and the plurality of address lines in a layout view, wherein the plurality of address lines are coupled through the plurality of vias to the first plurality of program lines, the first plurality of program lines extend from the plurality of vias to the first plurality of program decoders, and each of the first plurality of program lines has a length different from one another.

18. The method of claim 15, wherein the plurality of address lines are twisted in a twisted number, and the twisted number is determined based on a number of the first plurality of program decoders and a number of the second plurality of program decoders.

19. The method of claim 15, wherein coupling first program lines of the first plurality of program lines to a first program decoder of the first plurality of program decoders; and coupling second program lines of the first plurality of program lines to a second program decoder of the first plurality of program decoders, that is disposed next to the first program decoder;

wherein the plurality of address lines are further twisted between the first program lines and the second program lines.

20. The method of claim 15, wherein a first length of one of the first plurality of program lines is different from a second length of another one of the first plurality of program lines, and the first length is equal to a third length of one of the second plurality of program lines.

* * * * *